United States Patent [19]

Chew et al.

[11] Patent Number: 5,057,186
[45] Date of Patent: Oct. 15, 1991

[54] METHOD OF TAPER-ETCHING WITH PHOTORESIST ADHESION LAYER

[75] Inventors: Hongzong Chew, Allentown; Catherine A. Fieber, Upper Milford Township Lehigh County; Graham W. Hills, Salisbury Township Lehigh County; Edward P. Martin, Jr., Bethlehem, all of Pa.

[73] Assignee: AT&T Bell Laboratories, Murray Hill, N.J.

[21] Appl. No.: 597,295

[22] Filed: Oct. 12, 1990

Related U.S. Application Data

[63] Continuation of Ser. No. 387,254, Jul. 28, 1989, abandoned.

[51] Int. Cl.⁵ .......................................... H01L 21/306
[52] U.S. Cl. ................................ 156/643; 156/661.1; 430/317
[58] Field of Search ................... 156/643, 651, 659.1, 156/661.1; 430/313, 316, 317

[56] References Cited

U.S. PATENT DOCUMENTS

| | | | |
|---|---|---|---|
| 4,272,561 | 6/1981 | Rothman et al. | 156/643 |
| 4,484,978 | 11/1984 | Keyser | 156/651 |
| 4,705,596 | 11/1987 | Gimpelson et al. | 156/659.1 |
| 4,793,896 | 12/1988 | Douglas | 156/656 |
| 4,807,016 | 2/1989 | Douglas | 156/643 |
| 4,849,376 | 7/1989 | Balzan et al. | 437/228 |

FOREIGN PATENT DOCUMENTS

| | | | |
|---|---|---|---|
| 2738384 | 3/1978 | Fed. Rep. of Germany | 156/643 |
| 57-58321 | 4/1982 | Japan | 156/643 |
| 57-83034 | 5/1982 | Japan | 156/643 |

OTHER PUBLICATIONS

SPIE, vol. 772 (1987), "Tapered Wet Etching of Contacts Using a Trilayer Silox Structure," M. P. Karnett, pp. 166–171.

*Primary Examiner*—Richard V. Fisher
*Assistant Examiner*—John J. Bruckner
*Attorney, Agent, or Firm*—John T. Rehberg

[57] ABSTRACT

In a two-step etching process for making tapered contact openings in a dieletric, a thin layer of a material is interposed to serve as an adhesive between the dielectric and a photoresist layer the thin layer of material is chosen to remain essentially intact during undercut partial etching of the dielectric. As a result of enhanced adhesion, the photoresist layer remains more accurately positioned for subsequent anisotropic etching across the remainder of the thickness of the dielectric.

12 Claims, 1 Drawing Sheet

METHOD OF TAPER-ETCHING WITH PHOTORESIST ADHESION LAYER

This application is a continuation of application Ser. No. 07/387,254, filed on July 28, 1989 now abandoned.

TECHNICAL FIELD

The invention is concerned with electrical contacts and interconnections in the manufacture of integrated-circuit semiconductor devices, involving etching of windows in a dielectric.

BACKGROUND OF THE INVENTION

In the manufacture of integrated-circuit semiconductor devices, involving numerous operations including dopant-ion implantation, dielectric and metallic layer deposition, and photolithographic pattern definition and etching, it is desirable to produce etched openings or windows in dielectric layers having sloping or tapered profiles. Resulting openings may be intended for at least partial filling with a conductor material such as, e.g., aluminum, and sloping of profiles is largely in the interest of facilitating surface coverage by such material.

One method for making tapered openings, disclosed by M. P. Karnett, "Tapered Wet Etching of Contacts Using a Trilayer Silox Structure", *SPIE, Vol.* 772 (1987), pp. 166–171 involves etching of a three-layer structure deposited by chemical-vapor deposition, with a middle layer of phosphosilicate glass. Another familiar method uses twin etching steps, namely a step of wet etching so that a photoresist pattern is undercut, followed by a step of reactive-ion etching using the same photoresist pattern to further etch the dielectric straight through the remainder of its thickness.

One concern arising with methods involving wet etching of dielectric material arises with the tendency of photoresist material to separate from the dielectric in the course of etching, and the invention as described below is motivated by the desire for guarding against such tendency.

SUMMARY OF THE INVENTION

In a two-step etching process for making tapered contact or interconnection openings in a dielectric, a thin layer of a material is interposed to serve as an adhesive between the dielectric and a photoresist layer; such material is chosen to remain essentially intact during undercut partial etching of the dielectric. As a result of enhanced adhesion, the photoresist layer remains more accurately positioned for subsequent anisotropic etching across the remainder of the thickness of the dielectric. to center, by less than 5 micrometers.

DETAILED DESCRIPTION

Figure 1:
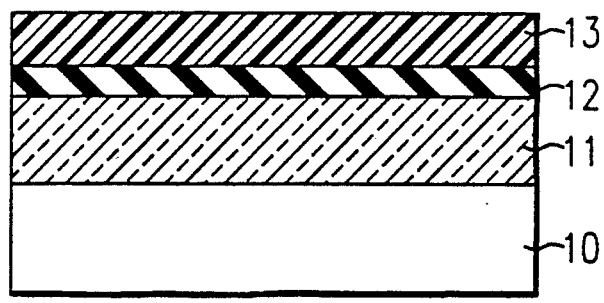
FIGS. 1–4 are schematic cross-sectional views of an integrated-circuit semiconductor device at sequential stages of exemplary processing in accordance with the invention. For the sake of ease of representation and appreciation dimensions are not to scale.

With reference to the Figures, an exemplary preferred embodiment of the invention involves structures and processing as follows:

FIG. 1 shows substrate 10 with dielectric material 11 to be etched, and additional layers 12 and 13 on the dielectric material, layer 13 being a photoresist layer, and layer 12 being interposed between dielectric 11 and layer 13 for the sake of enhanced adhesion of layer 13. The material of layer 12 is chosen such that it remains essentially unaffected by an etchant used for etching dielectric 11. In this respect, for example, when dielectric 11 consists essentially of silicon dioxide, and if a fluorocarbon chemistry is used for etching, polycrystalline silicon, amorphous silicon, or silicon nitride are suitable as layer-12 materials, typically approximately 100 to 200 angstroms thick. Conveniently, low-pressure chemical vapor deposition or plasma-enhanced chemical vapor deposition can be used for silicon or silicon nitride; also, for silicon, sputtering may be used.

Figure 2:
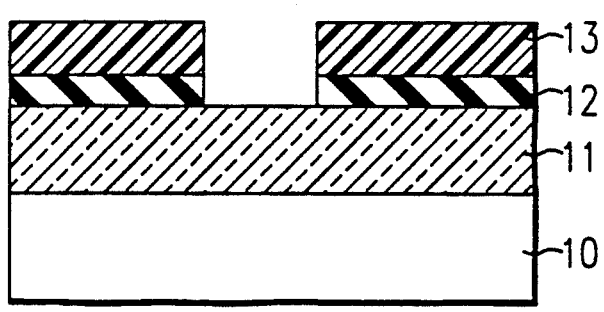

FIG. 2 shows the structure of FIG. 1 after patterning of photoresist layer 13 so as to uncover sites of contact openings, the diameter of openings being greater than or (more typically) equal to a design-rule limit.

Figure 3:
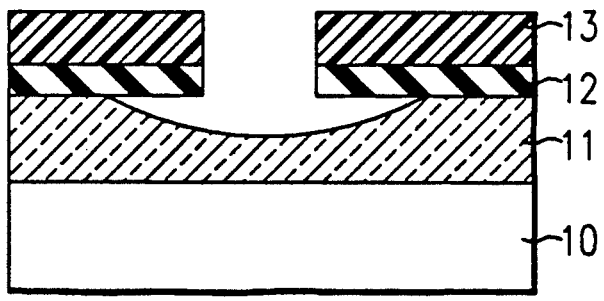

FIG. 3 shows the structure of FIG. 2 after etching, first across layer 12, e.g., by reactive-ion etching, and then into dielectric 11 by isotropic etching so as to undercut the photoresist layer 13 as well as unetched portions of layer 12. Due to undercutting, the diametr of the etched portion will be larger than the design-rule limit; for example, in the case of a 1.5-micrometer contact, such diameter may typically be about 2.3 micrometers (i.e., there is a 0.4-micrometer increase per side).

Figure 4:
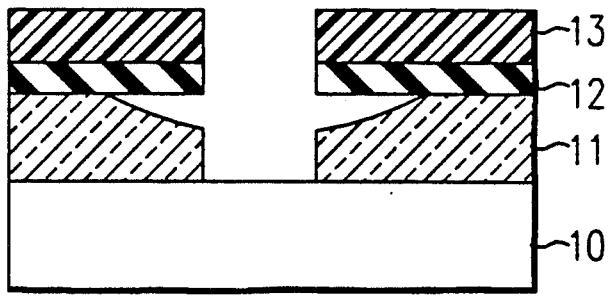

FIG. 4 shows the structure of FIG. 3 after further, anisotropic etching across the remainder of the thickness of layer 11, thereby completing the production of a desired opening. Then, in preparation for the deposition of a conductor material such as, e.g., aluminum or tungsten, photoresist layer 13 is stripped, and layer 12 is removed also.

With respect to materials included in structures undergoing processing in accordance with the invention, substrate 10 may be a body of semiconductor material which may be n- or p-doped at least at the point of windows. Also, substrate 10 may include conductor layers as made, e.g., of a conductive silicide or of a metal, on semiconductor or dielectric material. Etched openings may be intened for electrical interconnection between metallization levels. Dielectric layer 11 may be essentially conformal to substrate 10; alternatively, layer 11 may vary in thickness as produced, e.g., by planarization processing of a conformally deposited layer.

Layer 12, in addition to serving as an adhesion layer, may further serve as an antireflection layer, i.e., for the sake of preventing or minimizing unwanted reflections of actinic radiation during photoresist exposure. On silicon dioxide, the inclusion either of silicon or of silicon nitride as layer-12 material is beneficial in this respect as well. As antireflection considerations may arise also in the absence of concerns with adhesion between layers 11 and 13, it is important that an antireflection layer be chosen so as to maintain adequate adhesion of layer 13. For example, when dielectric 11 consists essentially of silicon nitride, concerns with adhesion of photoresist layer 13 are alleviated. Still, inclusion of an antireflection layer may be indicated, in which case attention is due the adhesion properties of the antireflection-layer material. In this case, silicon represents a suitable choice with respect to antireflection as well as adhesion functions.

The method is applicable to dielectric materials yet other than silicon dioxide or silicon nitride; in particular, application to silicon oxynitride and to aluminum oxide is contemplated. Furthermore, the method may be of interest in the case of borosilicate, phosphosilicate, or borophosphosilicate dielectrics. And, as layer-12 materials other than silicon and silicon nitride, titanium nitride, titanium oxide, titanium oxynitride, and titanium-tungsten may be chosen.

We claim:

1. A method for making an integrated circuit comprising the steps of:

making a dielectric opening in a dielectric, said dielectric opening being etched in the presence of a patterned photoresist layer, said photoresist layer having a photoresist opening with a first dimension, said etching comprising a first step of isotropic etching followed by a second step of essentially anisotropic etching, and prior to deposition of said photoresist layer, there being an additional layer deposited on said dielectric, the material of said additional layer being selected to enchance adhesion of said photoresist layer, said additional layer being etched to create an additional layer opening with a second dimension prior to said etching of said dielectric, said second dimension remaining substantially equal to said first dimension during both said isotropic and said anisotropic etching.

2. The method of claim 1 in which said dielectric comprises a material selected from the group consisting of silicon dioxide, silicon nitride, silicon oxynitride, aluminum oxide, borosilicate glass, phosphosilicate glass, and borophosphosilicate glass.

3. The method of claim 1 in which said additional layer comprises a material selected from the group consisting of silicon, silicon nitride, titanium nitride, titanium oxide, titanium oxynitride, and titanium-tungsten.

4. The method of claim 3, said additional layer having a thickness in the range from 100 to 200 angstroms.

5. The method of claim 1 in which said dielectric consists essentially of silicon dioxide, and in which a fluorocarbon chemistry is used for anisotropic etching.

6. The method of claim 1 in which essentially anisotropic etching is effective by reactive-ion etching.

7. The method of claim 1, integrated-circuit design rule being less than or equal to 3 micrometers.

8. The method of claim 1, further comprising making at least two said dielectric openings, said dielectric openings having centers which are spaced apart by less than or equal to 5 micrometers.

9. The method of claim 1 in which said dielectric material is conformally deposited.

10. The method of claim 1 in which said dielectric material has been planarized.

11. The method of claim 1, said dielectric opening exposing semiconductor material.

12. The method of claim 1, said dielectric opening exposing a conductor material.

* * * * *